US008076776B2

(12) United States Patent
Bhate et al.

(10) Patent No.: US 8,076,776 B2
(45) Date of Patent: Dec. 13, 2011

(54) INTEGRATED CIRCUIT PACKAGE HAVING SECURITY FEATURE AND METHOD OF MANUFACTURING SAME

(75) Inventors: Dhruv P. Bhate, Chandler, AZ (US); Sergei L. Voronov, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 169 days.

(21) Appl. No.: 12/456,450

(22) Filed: Jun. 16, 2009

(65) Prior Publication Data

US 2010/0314750 A1 Dec. 16, 2010

(51) Int. Cl.
*H01L 23/04* (2006.01)

(52) U.S. Cl. .............. 257/730; 257/797; 257/E23.179; 219/121.69

(58) Field of Classification Search ........... 257/797, 257/678, 730, E23.179; 156/DIG. 47, DIG. 48; 219/121.69; 430/22, 323, 324

See application file for complete search history.

(56) References Cited

U.S. PATENT DOCUMENTS

| 6,046,508 | A * | 4/2000 | Miyatake ............ 257/797 |
| 7,094,618 | B2 | 8/2006 | Tandy et al. |
| 7,157,131 | B1 | 1/2007 | Blish, II et al. |
| 7,169,687 | B2 | 1/2007 | Li |
| 7,303,977 | B2 | 12/2007 | Voronov |
| 2003/0132025 | A1 | 7/2003 | Wakihara et al. |
| 2006/0249816 | A1 | 11/2006 | Li |
| 2008/0156780 | A1 | 7/2008 | Voronov |
| 2008/0242054 | A1 | 10/2008 | Antonelli |

OTHER PUBLICATIONS

International Search Report and Written Opinion received for PCT Application No. PCT/US2010/029691, Mailed on Oct. 20, 2010, 8 pages.
Li, Eric J.; "Laser Assisted Chemical Vapor Deposition for Backside Die Marking and Structures Formed Thereby", U.S. Appl. No. 12/284,094, filed Sep. 17, 2008.
Vakanas, George, et al.; "Laser-Assisted Chemical Singulation of a Wafer", U.S. Appl. No. 12/288,627, filed Oct. 22, 2008.
Voronov, Sergei; "Methods for Concealing Surface Defects", U.S. Appl. No. 12/317,523, filed Dec. 24, 2008.
Yalukova and Sarady, 2005, "Investigation of interaction mechanisms in laser drilling of thermoplastic and thermoset polymers using different wavelengths," Composites Science and Technology, vol. 66, p. 1289-1296.

* cited by examiner

*Primary Examiner* — Jasmine Clark
(74) *Attorney, Agent, or Firm* — Kenneth A. Nelson

(57) ABSTRACT

An integrated circuit package comprises a package substrate (210, 410), an electrically insulating material (220, 420) adjacent to the package substrate, and a mark (230, 420) on the electrically insulating material. The mark is such that a visual contrast between the mark and the electrically insulating material is maximized when the mark and the electrically insulating material are exposed to coaxial illumination. In one embodiment the electrically insulating material over the package substrate has a first surface roughness and a mark on the solder resist material has a second surface roughness that is no more than approximately twenty times greater than the first surface roughness.

10 Claims, 4 Drawing Sheets

INTEGRATED CIRCUIT PACKAGE HAVING SECURITY FEATURE AND METHOD OF MANUFACTURING SAME

FIELD OF THE INVENTION

The disclosed embodiments of the invention relate generally to integrated circuit packages, and relate more particularly to security features in such packages.

BACKGROUND OF THE INVENTION

Manufacturers and sellers of microelectronic equipment and devices, including integrated circuits (ICs) and IC packages, desire to prevent the unauthorized sale of such devices, the sale of counterfeit goods passed off as genuine, and similar illegal or unauthorized activities. In order to discourage such activity, microelectronic devices are often provided with markings or other security features that are difficult to reproduce and that serve as proof that the marked article is genuine. Thus, for example, data regarding the origin, manufacturing history, or other information on an IC package or the like may be provided in a protected and proprietary font. Similarly, IC packages or other goods may be marked using techniques such as laser ablation, ink jet printing, and others.

BRIEF DESCRIPTION OF THE DRAWINGS

The disclosed embodiments will be better understood from a reading of the following detailed description, taken in conjunction with the accompanying figures in the drawings in which.

Figure 1A:
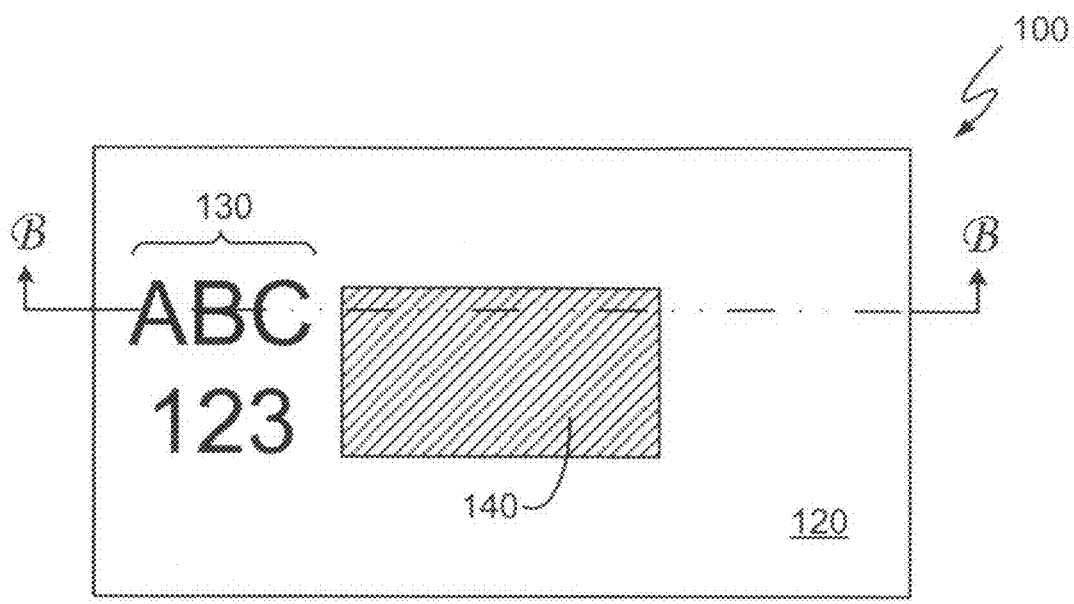
FIGS. 1A, 1B, and 1C are plan, cross-sectional, and detail views, respectively, of an integrated circuit package that is marked according to existing techniques.

For simplicity and clarity of illustration, the drawing figures illustrate the general manner of construction, and descriptions and details of well-known features and techniques may be omitted to avoid unnecessarily obscuring the discussion of the described embodiments of the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements, while similar reference numerals may, but do not necessarily, denote similar elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to" each other may be in physical contact with each other, in close proximity to each other, or in the same general region or area as each other, as appropriate for the context in which the phrase is used. Occurrences of the phrase "in one embodiment" herein do not necessarily all refer to the same embodiment.

DETAILED DESCRIPTION OF THE DRAWINGS

In one embodiment of the invention, an integrated circuit package comprises a package substrate, an electrically insulating material adjacent to the package substrate, and a mark on the electrically insulating material. The mark is such that a visual contrast between the mark and the electrically insulating material is maximized when the mark and the electrically insulating material are exposed to coaxial illumination. In one embodiment a solder resist material over the package substrate has a first surface roughness and a mark on the solder resist material has a second surface roughness that is no more than approximately twenty times greater than the first surface roughness.

Embodiments of the invention involve or enable the creation of a mark that is visible only under specialized lighting conditions, thus adding an additional layer of security not available with existing IC package security markings. As an example, and as further discussed below, embodiments of the invention involve marks that are not visible under ambient lighting conditions but are visible under "bright field" or coaxial illumination. Such marks cannot be made with conventional laser marking tools (e.g., infrared lasers or green lasers) commonly used in the packaging industry or with alternative schemes such as ink-jet printing. Accordingly, such marks may be useful in the detection and deterrence of counterfeiting and may be used to provide a robust method for detection of pirated parts. (It should be noted that the terms "infrared" or "IR" (laser wavelength greater than 760 nanometers (nm)), "green" (laser wavelength approximately 532 nm), and "ultraviolet" or "UV" (laser wavelength less than 400 nm) and the like are used herein to mean lasers of characteristic wavelength, which is inversely proportional to photon energy.)

Figure 1B:
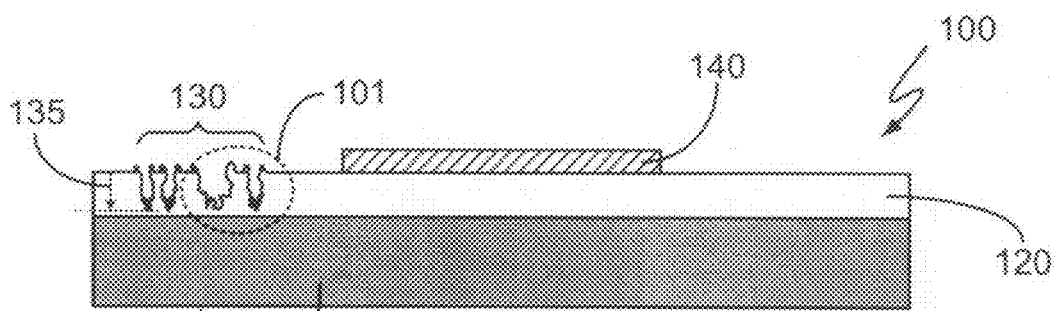
Figure 1C:
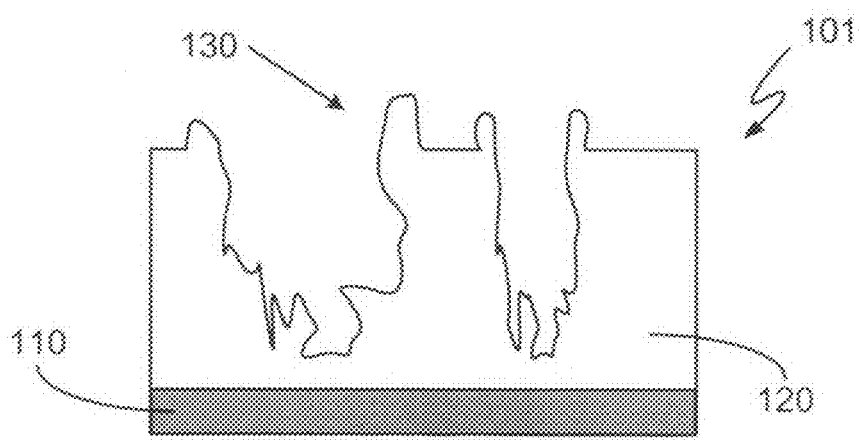
Figure 2A:
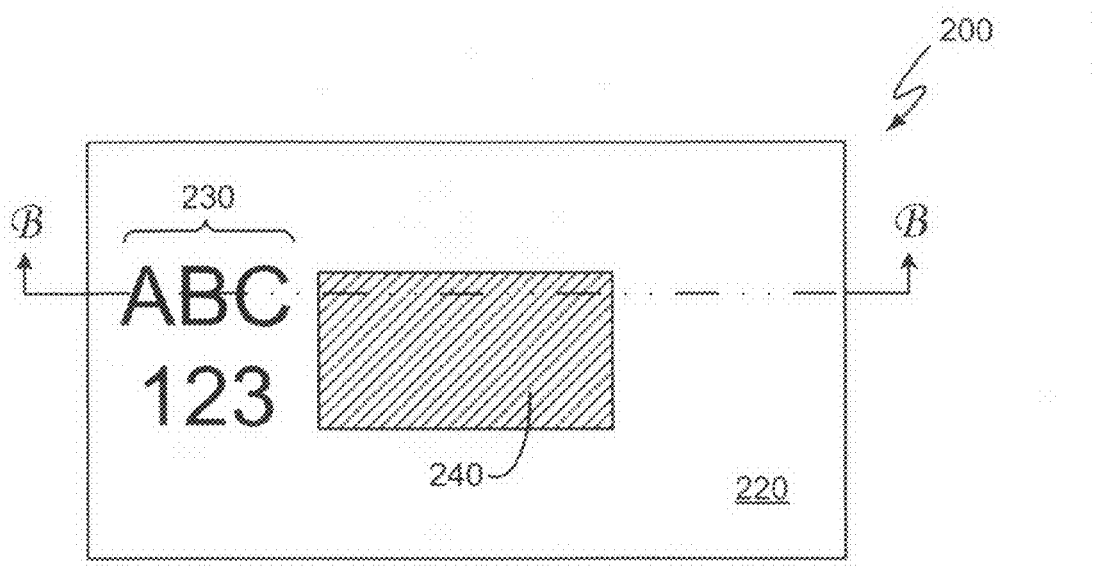
FIGS. 2A, 2B, and 2C are plan, cross-sectional, and detail views, respectively, of an integrated circuit package according to an embodiment of the invention.
Figure 2B:
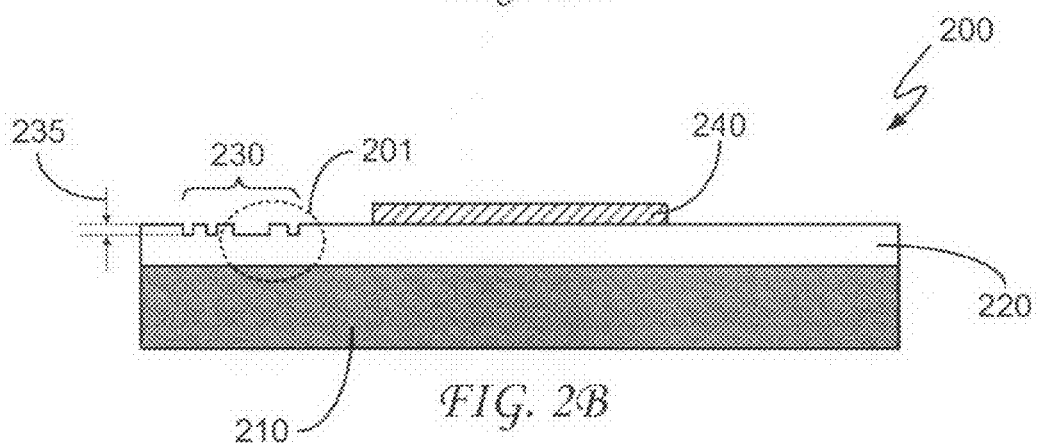
Figure 2C:
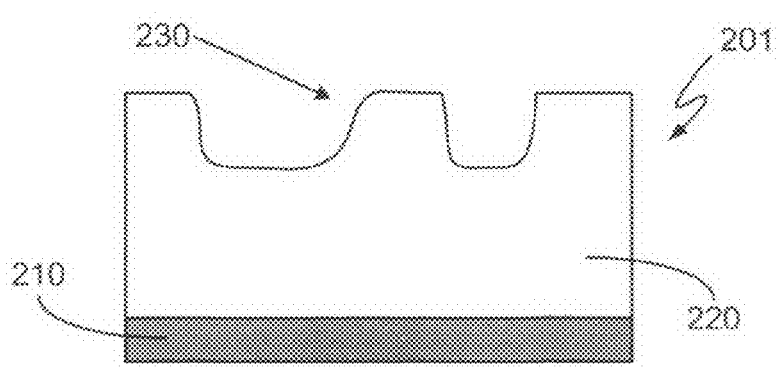

Referring now to the drawings, FIGS. 1A, 1B, and 1C are, respectively, plan, cross-sectional, and detail views of an integrated circuit package 100 that is marked according to existing techniques, and FIGS. 2A, 2B, and 2C are, respectively, plan, cross-sectional, and detail views of an integrated circuit package 200 according to an embodiment of the invention. FIG. 1B is taken at a line B-B as indicated in FIG. 1A. Similarly, FIG. 2B is taken at a line B-B as indicated in FIG. 2A. Furthermore, FIG. 1C depicts on an enlarged scale a portion 101 indicated in FIG. 1B, while FIG. 2C depicts on an enlarged scale a portion 201 indicated in FIG. 2B.

As illustrated in FIGS. 1A-1C, integrated circuit package 100 comprises a package substrate 110, an electrically insulating material 120 adjacent to package substrate 110, and a mark 130 on electrically insulating material 120. (The content of mark 130, as is the case with the content of all of the marks described herein, has been chosen for its ability to portray for illustrative purposes certain physical characteristics of the mark and does not necessarily approximate the appearance of a mark that would be created on an actual product.) A die 140 sits on or is located above electrically insulating material 120.

In the illustrated embodiment, mark 130 is created using a green laser marking tool, so called because it operates at wavelengths near the center of the visible spectrum (i.e., producing green light). Green lasers and the other lasers and marking tools using thermally-driven ablation techniques remove material in explosive fashion, creating marks having a surface roughness greatly changed from the original surface roughness of the material. This change in surface roughness is one mechanism by which a contrast is produced between the mark and the surrounding surface, which contrast is essential in order for a mark to be visible. (It should be noted that the terms "visible," "visual," and the like are used herein to mean "perceptible to the human eye.")

As illustrated, mark 130 has been carved out of electrically insulating material 120 to a depth 135, which typically ranges between 4 µm and 16 µm. Green laser marking tools and the other marking tools are not precise enough to carve out a mark of lesser or more controlled depth on integrated circuit packages or other electronic packages. It should be noted that future technology generations will likely have electrically insulating layers that are less than 16 microns thick due to assembly dimensionality constraints.

A surface roughness of mark 130 is approximately 100 or more times greater than a surface roughness of electrically insulating material 120. (It should be noted at this point that all surface roughness values given herein correspond to the $R_a$ metric.) A typical value for the surface roughness of electrically insulating material 120 might be between approximately 15 and approximately 55 nm, while a typical surface roughness for mark 130 might be approximately 5-8 micrometers (hereinafter "microns" or "µm"). As mentioned, differences in surface roughness of this magnitude create contrast with background surfaces through the differential scattering of light that in turn allows mark 130 to be visible.

Referring now to FIGS. 2A-2C, integrated circuit package 200 comprises a package substrate 210, an electrically insulating material 220 adjacent to package substrate 210, and a mark 230 on electrically insulating material 220. In one embodiment, electrically insulating material 220 is a solder resist material, a die attach film, or the like. A die 240 sits on or is located above electrically insulating material 220.

As known in the art, solder resist must have well-defined thermal properties, respond appropriately to the application of solder, have electrical insulating properties, and conform to other requirements that, like those mentioned, are required for its performance as part of an integrated circuit package. Because any change made to the solder resist material (as, for example, the introduction of a color-changing additive or the like) would likely have negative or unintended consequences for other parts of the integrated circuit package, circuit design rules do not permit such changes and, therefore, visibility of any marks on the solder resist must be created or achieved through other means.

In the illustrated embodiment, mark 230 is created using a UV laser. UV lasers can perform non-thermal or "cold" ablation on a variety of materials including solder resist material, die attach film, and other polymer-based surfaces. It should be noted that the wavelengths and materials mentioned are being used here in an illustrative sense; other wavelengths and other materials may also suffice to create a mark such as is described herein.

One of the definitions of so-called "cold" ablation is a material removal process that involves an orderly breaking of C—C and C—H chemical bonds by the "photo-chemical dissociation" mechanism that has ablation depth much more controllable than the explosive or evaporative displacement of material characterizing thermal ablation and thus is capable of producing marks that are very smooth, i.e., marks that have surface roughnesses close to that of the material in which they are made, and that do not change the inherent color of the material surface freshly exposed after ablation. Because of this, such marks are characterized by a lack of contrast or by a very small contrast between the mark and the surrounding surface, and are thus invisible or are difficult to see under normal lightning conditions (defined herein as lighting conditions in which the light striking an object does so at multiple different angles).

In the illustrated embodiment, mark 230 comprises a concave feature in electrically insulating material 220 that has been carved out of the electrically insulating material to a depth 235, which may typically be no greater than 5 µm, a depth well-suited for the thinner (sub-16 µm) electrically insulating layers of future technology generations. A depth of 5 µm, furthermore, is sufficient to ensure that the mark is permanent, i.e., that it can survive post-assembly conditions. A surface roughness of mark 230 is no more than approximately 20 times greater than a surface roughness of electrically insulating material 220 and in some embodiments may be no more than 4 or 5 times greater than the surface roughness of electrically insulating material 220. In at least one embodiment, the surface roughness of electrically insulating material 220 is no greater than an average wavelength of visible light, which is taken herein to be 550 nanometers. A typical value for the surface roughness of electrically insulating material 220 might be between approximately 15 nm and approximately 55 nm, while a typical surface roughness for mark 230 might be between approximately 60 nm and approximately 1 µm. As mentioned, differences in surface roughness of this magnitude create very little contrast, meaning that mark 230 is invisible or very hard to see under normal lighting conditions. If mark 230 has a surface roughness below approximately 300 nm, for example, and is made in a typical solder resist having a surface roughness of approximately 30 nm, for example, it is expected to be near-invisible to the naked eye under normal lighting conditions.

If mark 230 were invisible or difficult to detect under all lighting conditions it likely would have limited usefulness as a security feature. There are, however, lighting conditions under which mark 230 may easily be detected, as will be explained immediately below, thus further increasing its usefulness as a security feature because, for example, this characteristic acts as an additional barrier to counterfeiting. It is a characteristic of mark 230 that a visual contrast between the mark and electrically insulating material 220 is maximized when the mark and the electrically insulating material are exposed to coaxial illumination (see below). This characteristic may be achieved, for example, by creating surface roughnesses for the mark and the electrically insulating material that are in the ratios or ranges discussed above. Note that in this embodiment it is a physical property of the mark (its surface roughness compared with that of its background) that maximizes the visual contrast under coaxial illumination, even though it may be true that the described result of this physical property is only detectable through an act of observation.

Coaxial illumination, sometimes referred to as bright field illumination, is a lighting condition in which an object is illuminated from precisely the direction of the imaging lens (e.g., the same direction from which the object is viewed). In practice this may require a specialized viewing device, as will be further discussed below in connection with FIG. 3. As an example, coaxial illumination may be useful for the detection of smooth features on flat or nearly flat surfaces, i.e., just the sort of features created on electrically insulating material such as solder resist by a UV laser.

Figure 3:
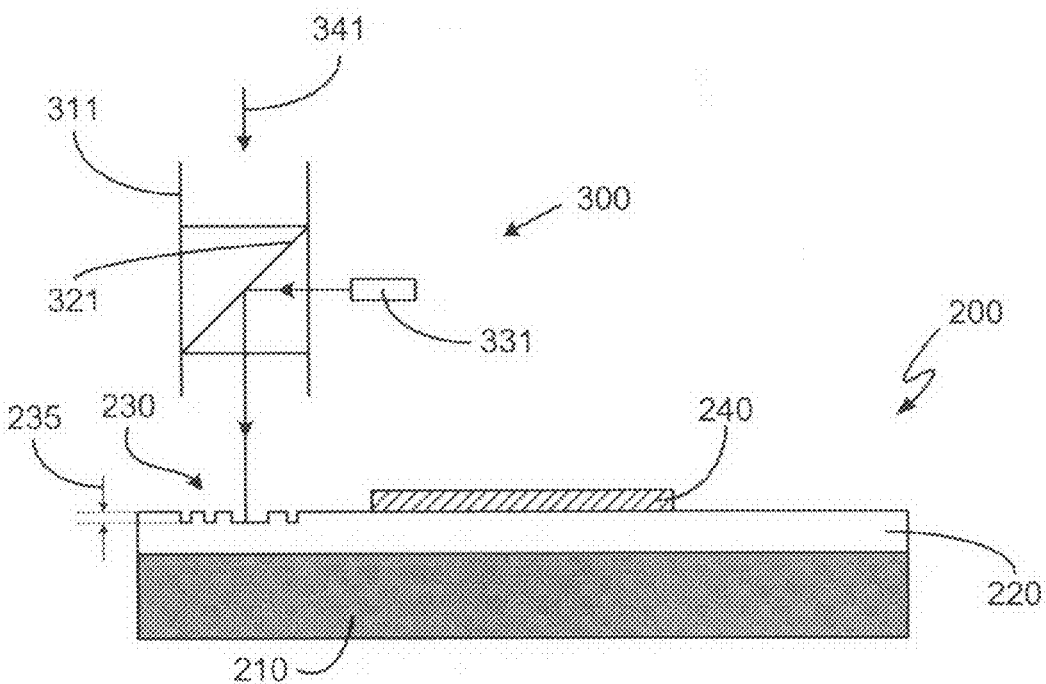
FIG. 3 is a side elevational view of a device capable of providing coaxial illumination of a mark according to an embodiment of the invention.

FIG. 3 is a side elevational view of a device 300 capable of providing coaxial illumination of mark 230. It should be understood that the FIG. 3 illustration is an example of just one device or lighting arrangement out of many that may be suitable for providing coaxial illumination of mark 230.

As illustrated in FIG. 3, device 300 comprises a housing 311 containing a mirror 321 arranged at approximately a 45 degree angle with respect to the sidewalls of housing 311. Mirror 321 reflects only part of the light incident upon it, letting some of the incident light through. When a light source 331 is made to shine into housing 311 and onto mirror 321, the mirror directs some of that light onto mark 230 in a direction indicated by an arrow 341. Light reflecting off mark 230 in a direction opposing arrow 341 may then be viewed from above housing 311 by looking in the direction of arrow 341.

Figure 4A:
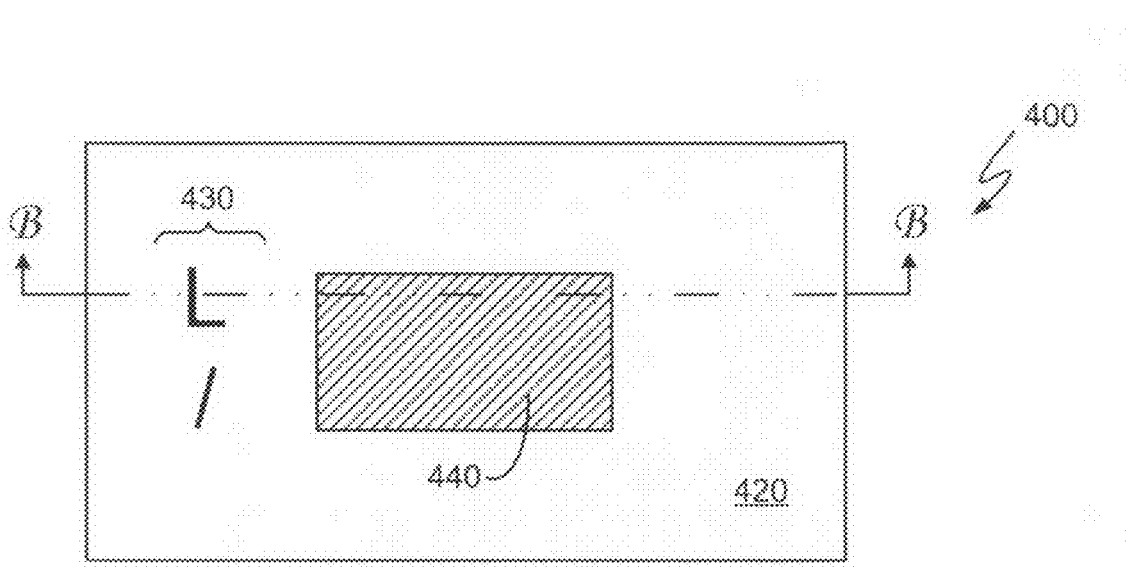
FIGS. 4A, 4B, and 4C are, respectively, plan, cross-sectional, and detail views of an integrated circuit package according to another embodiment of the invention.
Figure 4B:
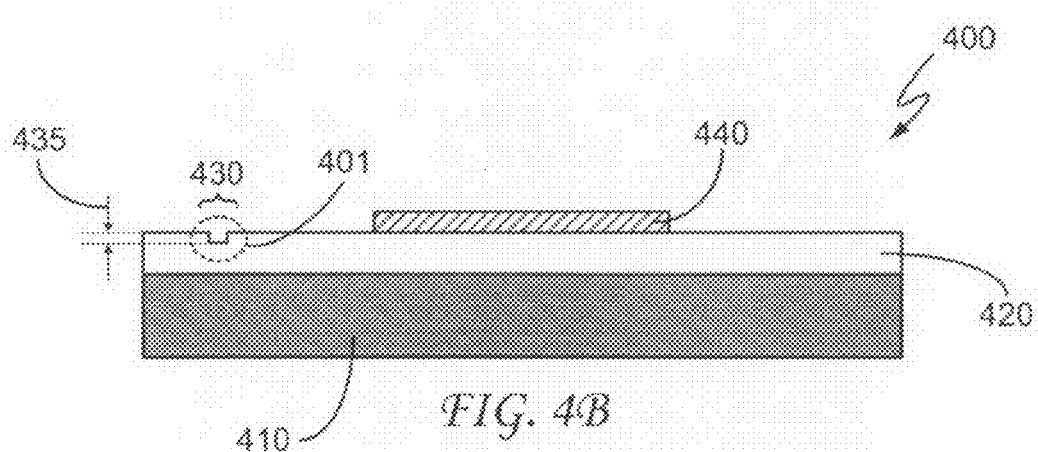
Figure 4C:
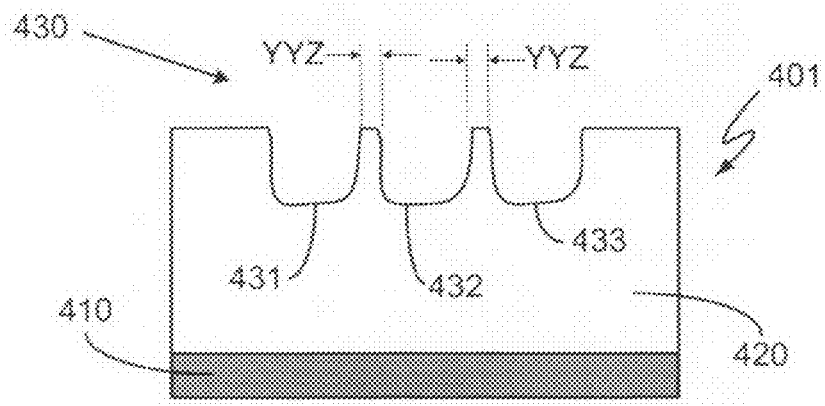

It was mentioned above that the characteristics limiting the visibility of mark 230 to coaxial illumination conditions represent an additional layer of security of the mark. In many situations this additional layer of security is a desirable feature but in some situations, such as where a coaxial illumination device is not available, it may be unwelcome. Accordingly, in some embodiments of the invention, a mark may be created with a UV laser as described above but modified so as to artificially provide enhanced contrast with the surface in which the mark is created sufficient to enable the mark to be seen under normal lighting conditions. Such modifications are described with reference to FIGS. 4A, 4B, and 4C, which are, respectively, plan, cross-sectional, and detail views of an integrated circuit package 400 according to an embodiment of the invention. FIG. 4B is taken at a line B-B as indicated in FIG. 4A. FIG. 4C depicts on an enlarged scale a portion 401 indicated in FIG. 4B.

As illustrated in FIGS. 4A-4C, integrated circuit package 400 comprises a package substrate 410, an electrically insulating material 420 adjacent to package substrate 410, and a mark 430 on electrically insulating material 420. In one embodiment, electrically insulating material 420 is a solder resist material, a die attach film, or the like. A die 440 sits on or is located above electrically insulating material 420.

In the illustrated embodiment, mark 430 is created using a UV laser and comprises a concave feature in electrically insulating material 420 that has been carved out of the electrically insulating material to a depth 435, which, like depth 235 (FIG. 2B), may typically be no greater than 5 µm. A surface roughness of mark 430 is no more than approximately 20 times greater than a surface roughness of electrically insulating material 420 and in some embodiments may be no more than 4 or 5 times greater than the surface roughness of electrically insulating material 420. In at least one embodiment, the surface roughness of electrically insulating material 420 is no greater than an average wavelength of visible light (taken herein to be 550 nanometers, as first mentioned above). Typical values for the surface roughnesses of electrically insulating material 420 and of mark 430 can be similar to those described above for electrically insulating material 220 and mark 230. As mentioned before, differences in surface roughness of such magnitudes create very little contrast, meaning that, as for mark 230, mark 430 would be invisible or very hard to see under normal lighting conditions. However, as stated above, mark 430 has been modified such that it is visible under normal lighting conditions, as will now be explained with particular reference to FIG. 4C.

Portion 401 of integrated circuit package 400 comprises concave portions 431, 432, and 433. (Three concave portions are shown for illustrative purposes. Various embodiments of the invention could alternatively contain more or fewer concave portions.) Adjacent pairs of these concave portions, i.e., the pair including concave portions 431 and 432 and the pair including concave portions 432 and 433, are separated from each other by no more than approximately 5 µm. In some embodiments the adjacent pairs actually overlap. In other words, mark 430 is made up of a plurality of features (i.e., the concave portions just discussed) having the property that adjacent ones of the plurality of features are separated from each other by no more than approximately 5 µm. Each of concave portions 431, 432, and 433 are, in the illustrated embodiment, created using a UV laser in the manner described above in connection with FIGS. 2A, 2B, and 2C and are thus each themselves a mark in their own right having the characteristics of mark 230. Among other things, this means that the individual concave portions cannot be seen by themselves under normal lighting conditions. However, the placement of multiple concave portions in close proximity in the manner described artificially creates contrast with electrically insulating material 420 sufficient to enable mark 430 to be visible under normal lighting conditions.

Figure 5:
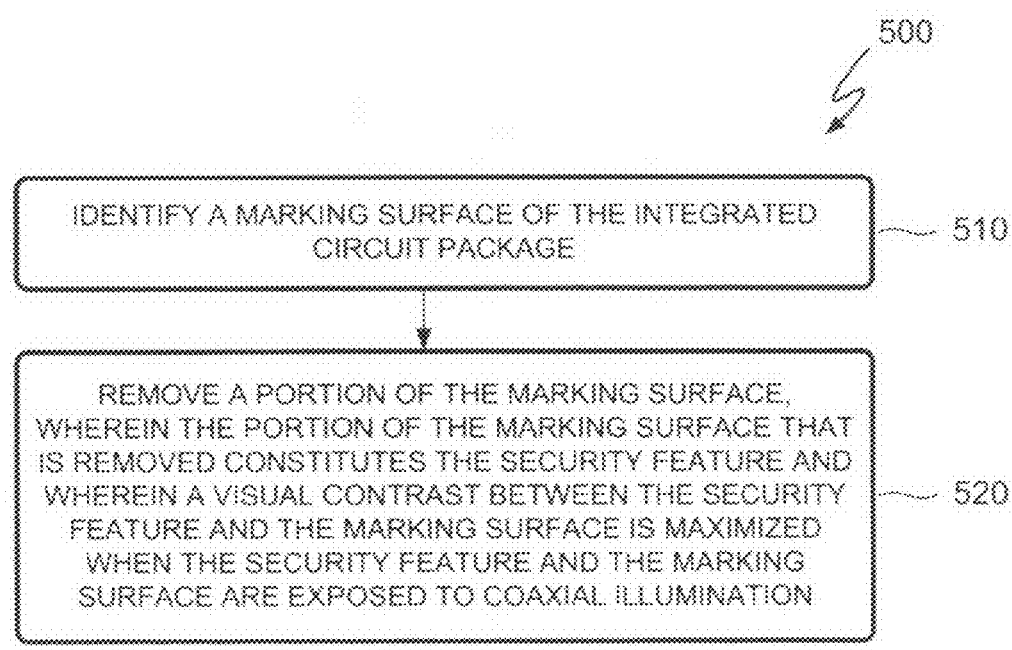
FIG. 5 is a flowchart illustrating a method of forming a security feature on an integrated circuit package according to an embodiment of the invention.

FIG. 5 is a flowchart illustrating a method 500 of forming a security feature on an integrated circuit package according to an embodiment of the invention. As an example, method 500 may result in the formation of a mark that is similar to mark 230 that is first shown in FIGS. 2A-2C. As another example, method 500 may result in the formation of a mark that is similar to mark 430 that is shown in FIGS. 4A-4C. 100331 A step 510 of method 500 is to identify a marking surface of the integrated circuit package. As an example, the integrated circuit package can be similar to integrated circuit package 200 or to integrated circuit package 400 that are shown, respectively, in FIGS. 2A-2C and FIGS. 4A-4C. As another example, the marking surface can be a portion of an electrically insulating material that forms a part of the integrated circuit package such as the portions shown in FIGS. 2A-2C and FIGS. 4A-4C. Accordingly, in one embodiment, the marking surface comprises a solder resist. In the same or another embodiment, step 510 comprises selecting as the marking surface a portion of the integrated circuit package having a first surface roughness no greater than 550 nanometers.

A step 520 of method 500 is to remove a portion of the marking surface, wherein the portion of the marking surface that is removed constitutes the security feature and wherein a visual contrast between the security feature and the marking surface is maximized when the security feature and the marking surface are exposed to coaxial illumination.

In one embodiment, step 520 comprises ablating the marking surface using a UV laser. In a particular embodiment the UV laser is operated at a wavelength of 355 nanometers. In a particular embodiment, step 520 comprises ablating the marking surface to a depth of no greater than five microns. In one embodiment, the performance of step 520 gives the security feature a second surface roughness that is no more than twenty times greater than the first surface roughness. In a particular embodiment, the second surface roughness is between five and ten times greater than the first surface roughness.

In one or more embodiments, step 520 comprises removing a plurality of sections of the marking surface in such a way that adjacent ones of the plurality of sections are separated from each other by no more than approximately 5 μm.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the integrated circuit packages and the related structures and methods discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. An integrated circuit package comprising:
a package substrate;
a solder resist material adjacent to the package substrate; and
a mark on the solder resist material, wherein the mark is such that a visual contrast between the mark and the solder resist material is maximized when the mark and the solder resist material are exposed to coaxial illumination.

2. The integrated circuit package of claim 1 wherein:
the mark comprises a concave feature in the solder resist material.

3. The integrated circuit package of claim 2 wherein:
the concave feature has a depth that is no greater than five microns.

4. An integrated circuit package comprising:
a package substrate;
a solder resist material over the package substrate, the solder resist material having a first surface roughness; and
a mark on the solder resist material, the mark having a second surface roughness, wherein the second surface roughness is no more than twenty times greater than the first surface roughness.

5. The integrated circuit package of claim 4 wherein:
the second surface roughness is between four and ten times greater than the first surface roughness.

6. The integrated circuit package of claim 4 wherein:
the first surface roughness is no greater than 550 nanometers.

7. The integrated circuit package of claim 6 wherein:
the second surface roughness is less than 300 nanometers.

8. The integrated circuit package of claim 4 wherein:
the mark comprises a concave feature in the solder resist material.

9. The integrated circuit package of claim 8 wherein:
the concave feature has a depth that is no greater than five microns.

10. The integrated circuit package of claim 4 wherein:
the mark comprises a plurality of features, wherein adjacent ones of the plurality of features are separated from each other by no more than 5 microns.

* * * * *